US012652976B2

(12) United States Patent
Gleick et al.

(10) Patent No.: US 12,652,976 B2
(45) Date of Patent: Jun. 9, 2026

(54) SYSTEMS AND METHODS FOR SILICON MICROSTRUCTURES FABRICATED VIA GREYSCALE DRIE WITH SOI RELEASE

(71) Applicant: Lawrence Livermore National Security, LLC, Livermore, CA (US)

(72) Inventors: Jeremy Robert Gleick, Pleasanton, CA (US); Razi-Ul Muhammad Haque, San Francisco, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 262 days.

(21) Appl. No.: 17/860,049

(22) Filed: Jul. 7, 2022

(65) Prior Publication Data

US 2023/0025444 A1 Jan. 26, 2023

Related U.S. Application Data

(60) Provisional application No. 63/224,737, filed on Jul. 22, 2021.

(51) Int. Cl.
*H10P 50/24* (2026.01)
*H10P 50/00* (2026.01)
(Continued)

(52) U.S. Cl.
CPC .......... *H10P 50/242* (2026.01); *H10P 50/691* (2026.01); *H10P 70/20* (2026.01); *H10P 72/0421* (2026.01); *G03F 7/16* (2013.01)

(58) Field of Classification Search
CPC .......... H01L 21/3065; H01L 21/02057; H01L 21/308; H01L 21/67069; H01L 21/3085;
(Continued)

(56) References Cited

U.S. PATENT DOCUMENTS

| | | | |
|---|---|---|---|
| 5,786,925 A | 7/1998 | Goossen et al. | |
| 2005/0029224 A1* | 2/2005 | Aspar | H01L 21/6835 216/33 |

(Continued)

FOREIGN PATENT DOCUMENTS

WO WO-2008121952 A1 10/2008

OTHER PUBLICATIONS

Khazi, Isman, Uma Muthiah, and Ulrich Mescheder. "3D free forms in c-Si via grayscale lithography and RIE." *Microelectronic Engineering* 193 (2018): 34-40.

(Continued)

*Primary Examiner* — Duy Vu N Deo
(74) *Attorney, Agent, or Firm* — HARNESS, DICKEY & PIERCE P.L.C.

(57) ABSTRACT

The present disclosure relates to a method for at least one of forming a part or modifying a part, and a system therefor. The method involves initially providing a planar structure having a first material layer disposed on a second material layer. A lithographic operation including greyscale printing is performed to produce a resist material layer on the first material layer, with the resist material layer having a predetermined three-dimensional pattern extending along X, Y and Z axes, with features helping to define the three-dimensional pattern having differing dimensions along the Z axis, and which acts as a mask. An etch process is then performed, using the mask provided by the resist material layer, to etch the first material layer to impart the pattern of the mask as an etched pattern into the first material layer in accordance with a predetermined selectivity etching ratio, such that the etched pattern in the first material layer includes features formed with greater dimensions than corresponding features in the mask of the resist material layer.

19 Claims, 7 Drawing Sheets

(51) Int. Cl.
 *H10P 70/00* (2026.01)
 *H10P 72/00* (2026.01)
 *G03F 7/16* (2006.01)

(58) Field of Classification Search
 CPC ........ G03F 7/16; G03F 7/0037; G03F 7/2051;
 G03F 7/423; B81C 2201/0157; B81C
 1/00103; B33Y 10/00; B33Y 30/00
 USPC ........................................................ 438/712
 See application file for complete search history.

(56) References Cited

U.S. PATENT DOCUMENTS

| | | | |
|---|---|---|---|
| 2014/0299967 A1* | 10/2014 | Smith ................. | H10N 30/082 |
| | | | 257/618 |
| 2015/0378095 A1* | 12/2015 | Hsu ........................ | H10F 55/25 |
| | | | 438/24 |
| 2018/0323318 A1* | 11/2018 | Engel ................. | H01L 31/0232 |
| 2020/0142120 A1 | 5/2020 | Meyer Timmerman Thijssen et al. | |
| 2021/0157042 A1* | 5/2021 | Rahomäki .......... | G02B 27/0172 |

OTHER PUBLICATIONS

Joo, Hannah R., et al. "A microfabricated, 3D-sharpened silicon shuttle for insertion of flexible electrode arrays through dura mater into brain." *Journal of neural engineering* 16.6 (2019): 066021.
International Search Report and Written Opinion, International Application No. PCT/US2022/037246, mailed Nov. 9, 2022, 8 pages.

* cited by examiner

A. Photolithography

B. Photoresist Bake

C. Silicon Etch          D. Photoresist Etch

E. Final Silicon Etch

F. Aluminum Etch and Oxide Release

| Photoresist | Silicon |
| Aluminum | Buried Oxide |

A. Photoresist Layer

- Greyscale Photolithography

- Simultaneous Si/PR DRIE Etching

- No Aluminum Etch Mask Needed

- Single Etch Step

B. Greyscale Lithography

| | Photoresist |
| | Silicon |
| | Buried Oxide |

C. Hybrid Si/PR DRIE Etch

D. Oxide Release

DRIE Mixed Substrate Etch
Deep Reactive-Ion Etch

• Etching Both Silicon and Photoresist

• Ratio 7:1 (silicon:photoresist)
  • Minimum 60 nm Steps Become 420 nm
    • Alternatives Possible

• Allows for Multiple Process Elements in a Single Etch Step

• Channel Etch
  • Through Etch for Release
  • Sharpening Etch

Results

* Successful Greyscale Procedure and DRIE Etch Process Developed
* Test Results Show Sharp Side Walls, Transfer of Pattern 30μm depth Scale bar
100μm

SYSTEMS AND METHODS FOR SILICON MICROSTRUCTURES FABRICATED VIA GREYSCALE DRIE WITH SOI RELEASE

CROSS REFERENCE TO RELATED APPLICATIONS

The present disclosure claims priority from U.S. Provisional Application Ser. No. 63/224,737, filed Jul. 22, 2021, the entire disclosure of which is hereby incorporated by reference into the present disclosure.

STATEMENT OF GOVERNMENT RIGHTS

This invention was made with Government support under Contract No. DE-AC52-07NA27344 awarded by the United States Department of Energy. The Government has certain rights in the invention.

FIELD

The present disclosure relates to processes for forming parts from wafers, and more particularly to a method for forming micron scale parts using a combination of lithography, etching and lift off operations to significantly improve efficiency and speed in manufacturing micron scale parts.

BACKGROUND

The statements in this section merely provide background information related to the present disclosure and may not constitute prior art.

While etching individual steps into a silicon wafer one at a time can be achieved, fabricating complex patterns of multiple steps can be an extremely time-consuming process. Such etching of individual steps requires hands on work from an expert engineer, as well as producing a greatly reduced final yield due to errors accumulating over a large number of process steps.

Existing methods allow for a variety of three-dimensional structures in silicon, but any given method has its own fairly rigid limitations. For example, etches can be performed on specialized silicon wafers to achieve diagonal slopes, but only at a single angle across the wafer, and still further, the etching is limited to certain specific angles. As another example, isotropic etches can be performed through gaps in a masking material, allowing for the same vertical etch, but only providing a single etch depth at all exposed points across the wafer. While repetition of this could potentially replicate the result of the new process described herein below, it would require as many as 80 steps, with each step representing a process that may take multiple hours of hands-on professional engineering, and even then such a laborious hands-on process would accumulate prohibitive errors during the overall process.

FIGS. 1a-1e summarize the highly repetitive operations of a typical prior art process which requires alternately etching the silicon and resist layers to achieve a final, multi-layered silicon part. As one should appreciated, this is an extremely time consuming and laborious process which, even if performed with the utmost care by the designer, still can produce a significant number of errors during the process.

SUMMARY

This section provides a general summary of the disclosure, and is not a comprehensive disclosure of its full scope or all of its features.

In one aspect the present disclosure relates to a method for at least one way of forming or modifying a part. The method may comprise providing a planar structure having a first material layer disposed on a second material layer. The method may further include using a lithographic operation including greyscale printing to produce a resist material layer on the first material layer, the resist material layer having a predetermined pattern formed along X, Y and Z axes, and with features helping to define the predetermined three-dimensional pattern having differing dimensions along the Z axis, and which acts as a three-dimensional mask. The method may further include using an etch process, together with the mask provided by the resist material layer, to etch the first material layer to impart the pattern of the mask as an etched pattern into the first material layer in accordance with a predetermined selectivity etching ratio, such that the etched pattern in the first material layer includes features formed with differing dimensions than corresponding features in the mask of the resist material layer.

In another aspect the present disclosure relates to a method for forming a part. The method may include providing a silicon on insulator (SOI) planar wafer having a silicon material layer disposed on a buried oxide layer. The method may further include using a lithographic operation including greyscale printing to produce a resist material layer on the silicon material layer, with the resist material layer having a predetermined three-dimensional pattern extending along X, Y and Z axes, which acts as a mask. The three-dimensional pattern has features which help define the three-dimensional pattern which with differing dimensions in the Z axis. The method may further include using an etch process, together with the mask provided by the resist material layer, to etch the silicon material layer to impart the pattern of the mask as an etched pattern into the first material layer in accordance with a predetermined selectivity etching ratio, such that the etched pattern in the first material layer includes features formed with differing dimensions than corresponding features in the mask of the resist material layer. The method may further include removing the buried oxide layer to leave only the silicon material layer.

In still another aspect the present disclosure relates to a system for at least one of forming or modifying a structure. The system may comprise a lithographic subsystem configured to form a resist material layer on a first material layer of the structure, wherein the resist material includes a mask having a predetermined three-dimensional pattern formed along X, Y and Z axes. The predetermined three-dimensional pattern includes features which help to define the predetermined three-dimensional pattern which extend along differing dimensions in the Z axis. An etch subsystem may be included which is configured to etch the first material layer using the mask and a predetermined selectivity etch ratio. The etching creates a new pattern in the first material layer which corresponds to the pattern formed in the resist material layer, but which has features that are differing dimensions, by a predetermined factor in accordance with the predetermined selectivity etch ratio, than corresponding features in the resist material layer.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure may be viewed in one aspect as a method by which complex silicon objects with dimensions on a micron scale, as well as a sub-micron scale, can be fabricated in moderate to large quantity, in a highly time and cost efficient manner. Structures of more or less arbitrary shape (or a non-overhanging shape) can be produced by the method, with micron resolution of at least approximately 1 μm×1 μm×0.05 μm or even finer. The present disclosure enables the equivalent of at least approximately 80 individual lithography plus etch procedures, or an even greater number if using a resist specifically designed for Greyscale use, to be performed in a single lithography/etch process, while simultaneously preparing the final product for release from a wafer.

The method of the present disclosure includes operations directed to lithography, etching, and a removal or "liftoff" operation. One specific example of the etching operation is a Deep Reactive-Ion Etching ("DRIE") operation. One specific example of a liftoff will be given with reference to using a SOI ("Silicon-On-Insulator") waver. These operations will be explained with reference to the flowchart 100 of FIG. 2, which provides one specific example using a SOI wafer and a DRIE etch operation. It will be appreciated, however, that the reference to the DRIE process is just one example of a suitable etch process that may be used with the present disclosure, and there are other, alternative etch methods that can also produce anisotropic etching in silicon or other materials. Such other etch methods that may potentially be used to perform the etch operation described herein may be, for example and without limitation, "High Density Low Pressure" (HDLP) plasma etching, electron cyclotron resonance plasma etching; inductively coupled plasma etching; and RF (Radiofrequency) Helicon Wave Etch (which is particularly effective when used for Gallium-Arsenide etching, a major semiconductor material).

Figures 1A, 1B, 1C, 1D, 1E:
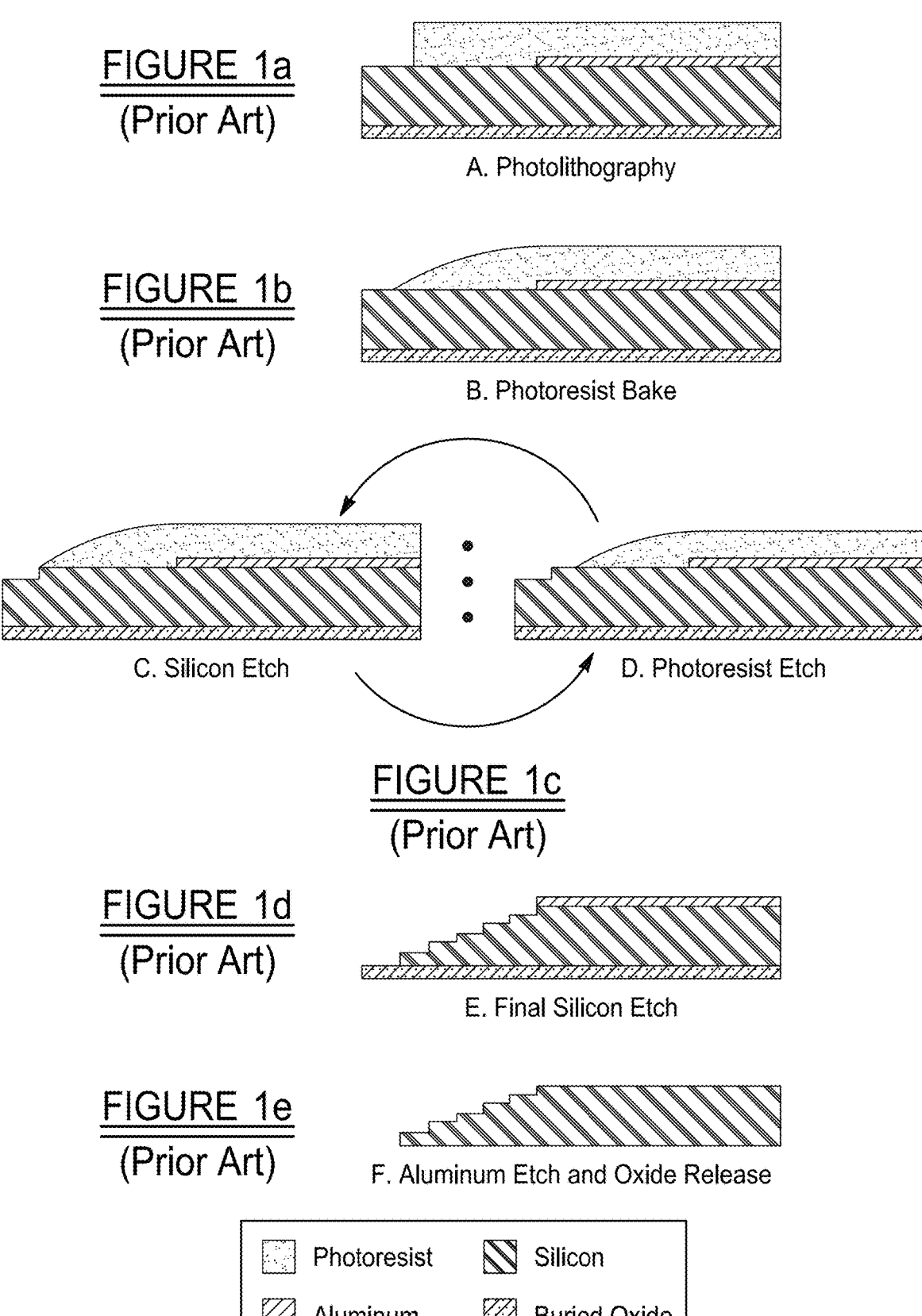
FIGS. 1a-1e illustrate the highly repetitive operations that are needed using a prior art process to produce a complex silicon part using alternating etch steps for the silicon and resist materials.
Figure 2:
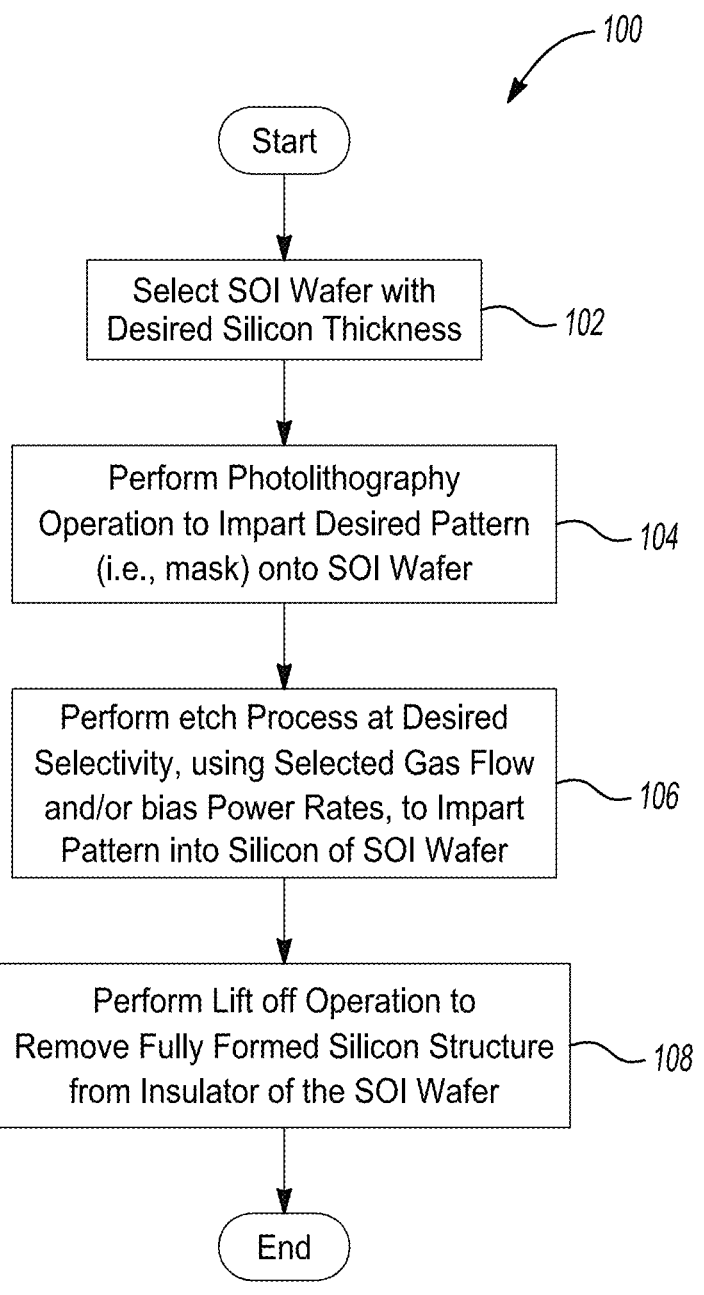
FIG. 2 is a flowchart illustrating high level operations which may be performed in accordance with one example of a method of the present disclosure.

Initially at operation 102 in FIG. 2, a planar SOI wafer is selected with a desired silicon material layer thickness. An initial lithography operation may be performed, as indicated at operation 104. Operation 104 may be a standard lithography procedure, but may make use of a greyscale lithography technique to produce a three-dimensional ("3D") pattern in the resist material layer upper surface. The three-dimensional pattern of the resist material layer thus is formed to have X, Y and Z axes, with features having differing dimensions along the Z axis.

Different resists, exposure tools, and developer chemicals can be used to suit the needs of a specific application. The greyscale parameters used for printing may vary significantly, but in one example a Heidelberg MLA 150 Advanced Maskless Aligner, available from Heidelberg Instruments GmbH, of Heidelberg, Germany, using an exposure from 0 to 510 mJ/cm$^2$, in steps of 2 mJ/cm$^2$, may be used to perform the greyscale printing. The photoresist response may be observed, for example, between 40 mJ/cm$^2$ and 200 mJ/cm$^2$, and is highly linear. Generally, about 75 or slightly more steps can be performed reliably using a greyscale printing technique. In one example an average "step" height of 60 nm can be achieved.

The next operation, as indicated at operation 106, involves a deep Reactive-Ion Etch ("DRIE") processing operation. The DRIE process is a microfabrication process by which isotropic vertical etching produces a clean, one-direction etch. The DRIE process is usually tailored to provide a high selectivity to etch only silicon, with near-zero resist etching, allowing the patterned resist material layer to be used as a mask. However, the present disclosure involves adjusting a gas flow and/or bias power rates to produce a different selectivity etching ratio depending on the desired height of the final object. For example, a 1:1 selectivity etching will etch the resist material layer and the silicon material layer at the same rate, eventually producing in the silicon material layer the exact same three-dimensional pattern, including the same depth or height of features that were originally developed into the surface of the resist material layer. A 10:1 selectivity etching ratio of the silicon and the resist (Si:Resist) produces a pattern in the silicon material layer having features with 10× greater step heights (i.e., along the Z axis) than the corresponding features formed in the original pattern etched in the resist material layer, while maintaining the same layout (i.e., pattern) in the resist material layer. This enables the fabrication of silicon structures having features which can be made significantly taller than the thickness of the original resist material layer. While the selectivity etching ratio used will depend in large part on the specific application and the part being constructed, it is expected that many, if not most, applications, will involve using ratios from 1:1 to 20:1. Still further, an etch ratio of 1:2 could be used, wherein features formed in the silicon material layer are shorter in the Z dimension than the corresponding features formed in the original pattern in the resist material layer. It will be appreciated, then, that the present disclosure is not limited to any specific etch ratio, and the specific etch ratio chosen for a specific application will be dictated at least in part by the needs of the application.

It will be understood that the pattern formed in the resist material layer in the original lithography operation described above includes areas exposed so as to receive a maximum silicon etch from the etching operation, which in one form as noted above may be a DRIE operation. If performed on a Silicon-On-Insulator (SOI) wafer, etch rates and thickness can be carefully tailored during the etch process so that select regions etch fully through the silicon material layer of the SOI wafer. In this manner, after the etch operation, the underlying insulator of the SOI wafer is exposed in the desired locations only, while the desired structure has been imparted into the silicon material layer across the rest of the SOI wafer.

After the above-described etch operation is completed, a liftoff or "release" operation may be used to dissolve the insulating layer, as indicated at operation 108 in FIG. 2. This enables the separation of sections of the remaining silicon material layer from the insulator layer as individual silicon objects. This separation operation may be performed using oxide insulator wafers and hydrofluoric acids, although other material combinations may be possible. In one specific example, a hydrofluoric (HF) acid bath of 40%-60%, and more preferably about 49% hydrofluoric acid, mixed together with another aqueous solution, such as water, is provided in which the etched SOI wafer is fully submerged. The submergence is typically carried out for about 24-36 hours, which dissolves the oxide layer portion remaining on the SOI wafer. The precise time period required may depend on the specific materials being used.

The inclusion of additional steps before the lithography operation, or between the etch and liftoff operations, may be used to help produce final objects with additional materials, for example neural implantable devices or other micromachines or microelectronics.

Figure 3A:
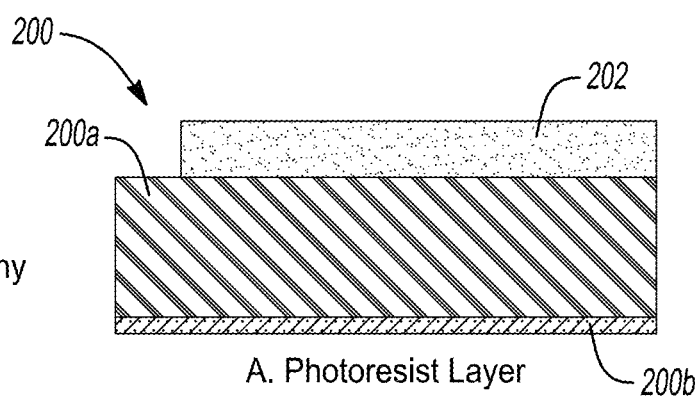
FIGS. 3a-3d show highly enlarged, highly simplified side cross sectional diagrammatic views of a SOI wafer and resist being processed using the method of the present disclosure to create a complex, silicon structure.
Figure 3B:
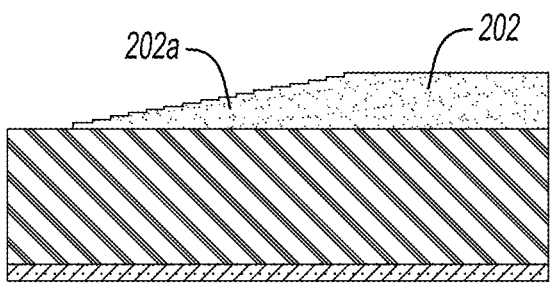
Figure 3C:
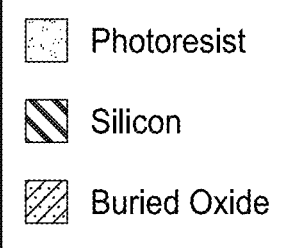
Figure 3C:
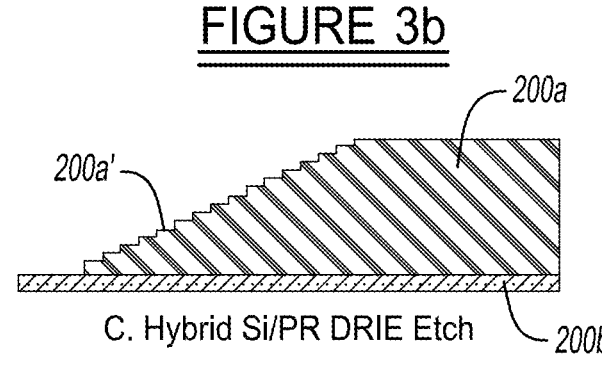
Figure 3D:
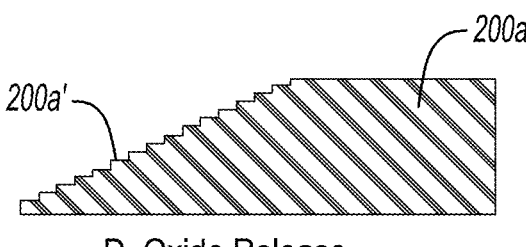

FIGS. 3a-3d show a series of highly simplified, highly enlarged, diagrammatic illustrations to further illustrate the operations described above. In FIG. 3a wafer 200, in this example a SOI wafer, has a silicon layer 200a formed on a buried oxide layer 200b. On an upper surface of the silicon layer 200a is applied a layer of resist material 202. The resist material layer 202a is acted on during a lithography process using a greyscale printing operation to form a plurality of nanoscale steps 202a, as shown in FIG. 3b. At this point the resist material layer may be viewed as forming a mask having a desired pattern. At FIG. 3c, the DRIE etching operation has been used to etch the stepped pattern 202a into the silicon layer 200a, to create a surface 200a' having the same pattern as that of the resist material layer 202. It will be noted that the DRIE process has completely removed the resist material layer. FIG. 3d shows the silicon layer 200a after the buried oxide layer 200b has been removed via the hydrofluoric acid bath operation described above.

Figure 4:
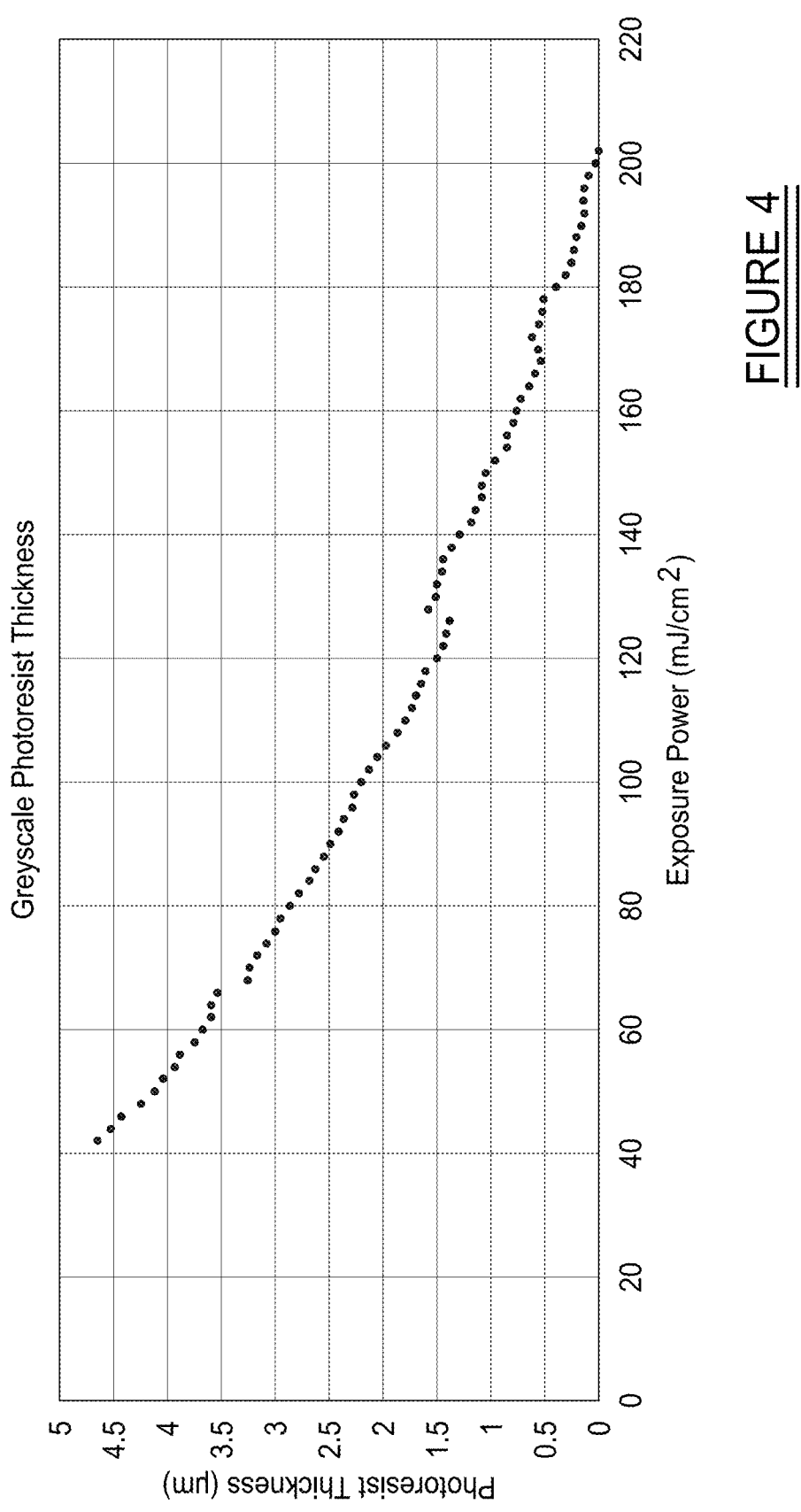
FIG. 4 shows an exemplary graph of exposure power (in mJ/cm$^2$) vs. photoresist thickness to illustrate the highly precise, step-wise depth changes that can be achieved during a greyscale printing operation using the teachings of the present disclosure.

FIG. 4 shows an exemplary graph of exposure power (in mJ/cm²) vs. final photoresist thickness after development to help illustrate the highly precise, step-wise depth changes that can be achieved in the photoresist material layer during a greyscale printing operation.

Figure 5A:
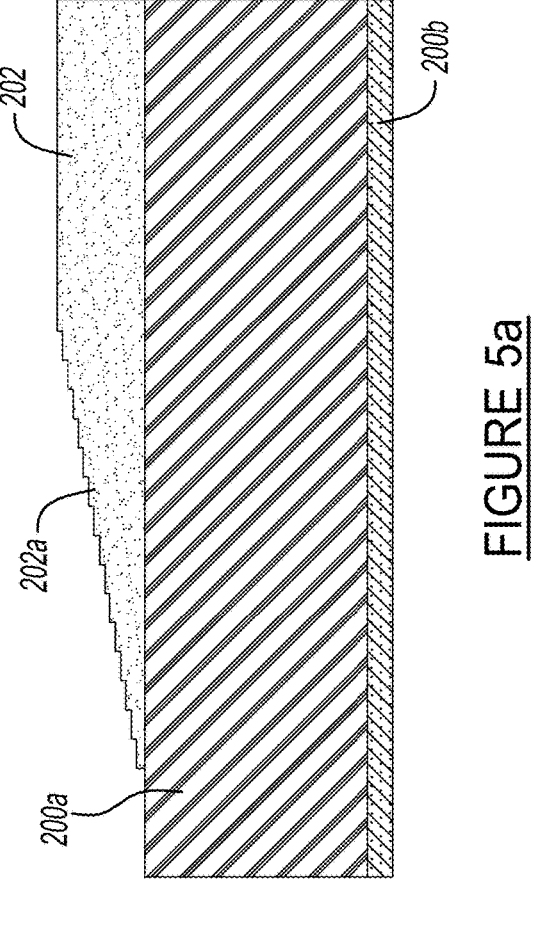
FIGS. 5a and 5b show highly enlarged, simplified side views of a portion of an SOI wafer with a resist mask etched thereon using a ratio of 7:1 (silicon:resist) to show how minimum 60 nm steps formed in the resist material layer (FIG. 6a) become 420 nm steps in the silicon material layer (FIG. 6b)
Figure 5B:
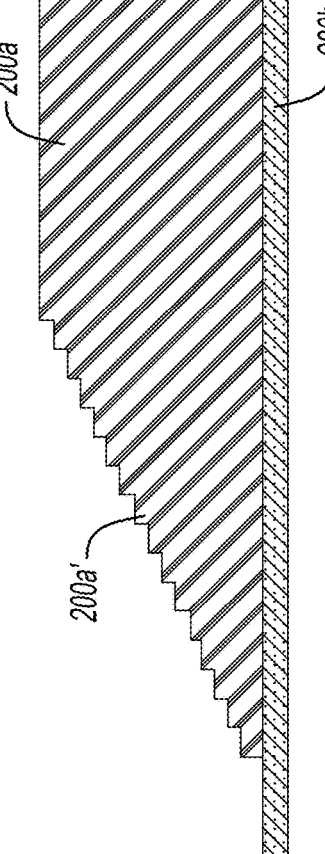

FIGS. 5a and 5b show highly enlarged, simplified side views of a portion of the SOI wafer 200 with a resist material layer 202 having a mask etched thereon. These figures show how using an etch ratio of 7:1 (silicon:resist), the 60 nm steps formed in the resist material layer 202 (FIG. 5a) become 420 nm deep steps (FIG. 5b) formed in the silicon material layer 200a of the SOI wafer 200 when the DRIE process is complete.

Figure 6:
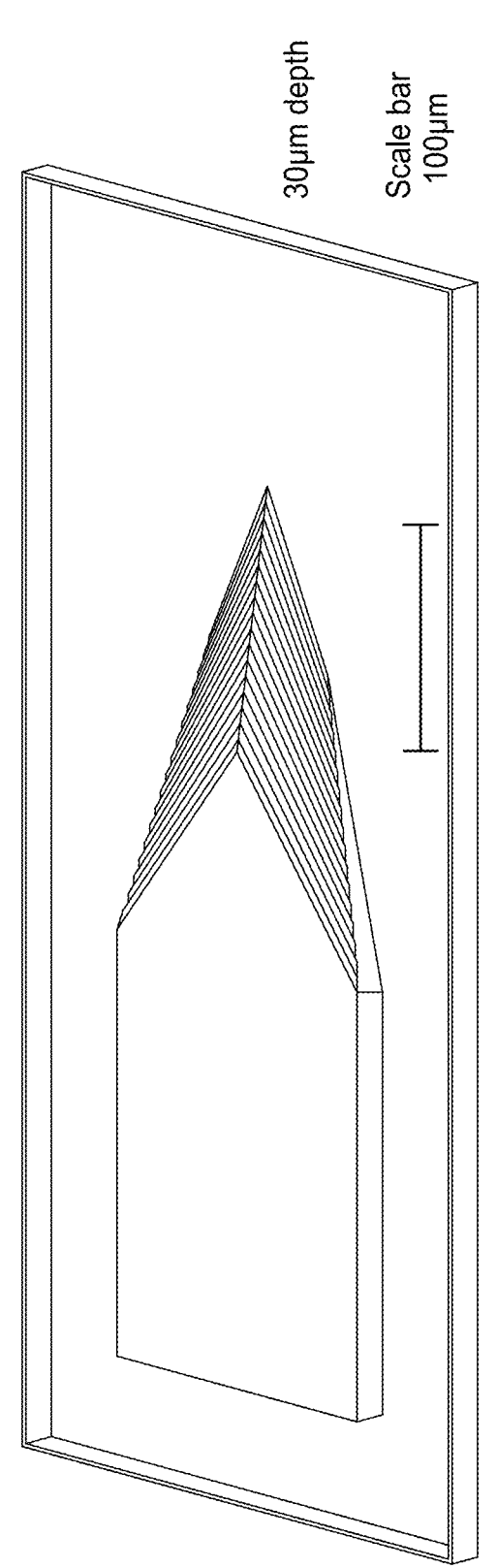
FIG. 6 shows a scanning electron microscope (SEM) image of a silicon material layer etched using the method of the present disclosure, which illustrates the high resolution, complex shape that can be achieved in the finished silicon layer.

FIG. 6 shows an SEM image of a silicon layer after being etched using the DRIE process described herein. Some remaining photoresist remains visible (black) on the surface of the wafer. It will also be appreciated that in some applications, a cleaning step to clear off any leftover photoresist may be needed or helpful.

Figure 7:
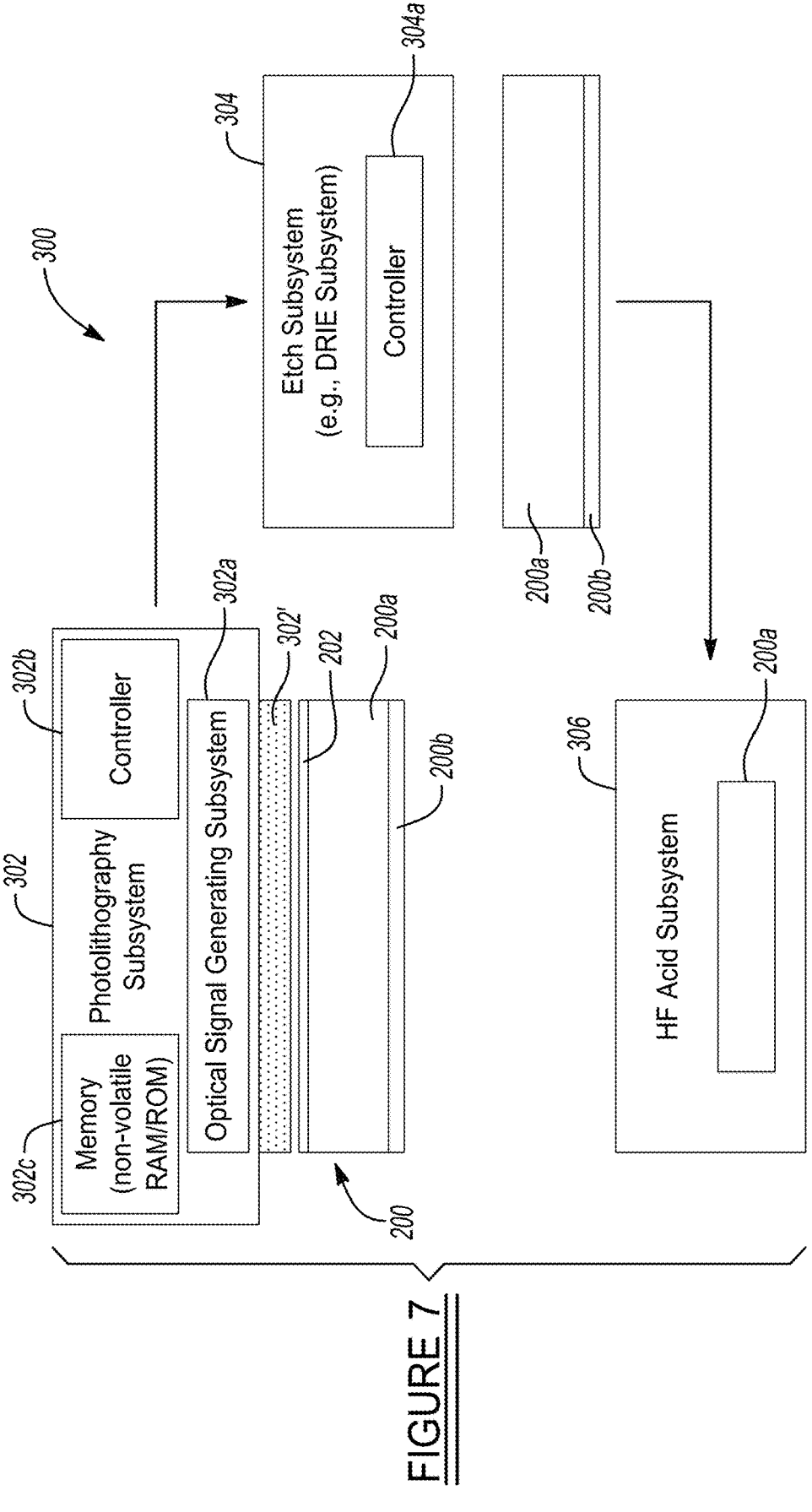
FIG. 7 shows a high level block diagram of a system in accordance with the present disclosure.

Referring briefly to FIG. 7, one embodiment of a system 300 in accordance with the present disclosure is shown. The system 300 includes a lithographic printing subsystem 302 for generating an optical output 302' to perform a lithographic operation, including greyscale printing, on the resist material layer 202 to create a desired pattern or mask using the resist material layer. The lithographic printing subsystem 302 may include an optical signal generating subsystem 302a, a controller 302b for controlling the optical signal generating 302a, and a memory 302c for storing software, variables or other information needed for the printing process. An etch subsystem 304 may be included, and may have a controller 304a, and in one embodiment may be a DRIE etch subsystem. The etch subsystem 304 is used to controllably etch the silicon material layer 200a using the resist layer 202 as a mask or template, leaving just the silicon material layer 200a with a desired pattern, and the buried oxide layer 200b underneath it. A hydrofluoric acid bath subsystem 306 is included for dissolving the buried oxide layer 200b, leaving only the etched silicon material layer 200a.

It will also be appreciated that the greyscale printing and DRIE etch operations discussed above are not limited to silicon-only fabrications, or to any specific type of part or component. These operations, when used together, can significantly speed up existing processes; that is, virtually any prior art manufacturing operation which would require multiple anisotropic etch operations can be compressed to virtually one anisotropic etch operation.

While the present disclosure is expected to find significant applications involving the use of photolithography systems and methods to form the resist material layer, it is also envisioned that non-photon driven lithography methods may also be used to form the resist. E-beam lithography is one such non-photon lithography method that may be employed to form the resist material layer described herein.

It is expected that the teachings presented herein will be particularly useful and effective in increasing surface area of an electrode or region while maintaining a relatively flat surface profile, allowing improved electrode function, improved adhesion of other material layers, or other possible applications that benefit from increases in surface area while maintaining the same design footprint. Still further applications are expected to involve manufacturing partially penetrating electrodes for use in electrode applications, to achieve even higher fidelity recording from peripheral nerve bundles or other targets of interest. Still further additional applications of the method and system of the present disclosure are expected to involve silicon lens fabrication, and development in structures made from materials other than silicon. Essentially any material that can be DRIE etched simultaneously with a resist or other patternable layer could be processed using the teachings of the present disclosure. Still another application of the teachings of the present disclosure may be in creating sharpened soft-material devices such as polyimide neural implants for enhanced direct surgical insertion without need of a rigid surgical shuttle.

Still another potential, highly valuable application is expected to be in connection with the manufacture of electrochemical cells such as batteries. Such manufacturing operations involving batteries may see significant improvements in manufacturing efficiencies and/or battery performance through the surface patterning that the present disclosure provides. Yet another possible application is in connection with mold making.

Additional applications where the teachings of the present disclosure are expected to find utility are in connection with the manufacture of objects having many steps and/or sharpened objects of any angle; in connection with hard material molds that could be used to create virtually arbitrarily shaped soft material structures; electrodes with surface patterning to increase area while retaining a nearly flat profile (with optional surface roughening); and partially penetrating electrode arrays made as one contiguous piece (contiguousness is not necessary but may be useful or beneficial). It will also be appreciated that the present disclosure may be used to modify a surface of an existing part, as well as to help construct a new part.

Still further applications where the teachings of the present disclosure are expected to find utility are in connection with molding processes. For example, a glass reflow process could benefit from an arbitrary-shaped silicon structure (mold). Additional details of this potential application may be found in U.S. Pat. No. 8,707,734 B2, hereby incorporated by reference into the present disclosure. Fabrication of micro-scale optical elements such as, without limitation, waveguides, micromirrors and light-coupling elements are additional potential applications. Still another possible application is for macroscale input guides for microscale alignment (such as for fiber and fluidic ports). Still another application may be chip-scale packaging, for example, creating patterns for self-alignment of chip-on-chip or chip-on-board (e.g., surface height changes of pads). By preparing two 3d patterned surfaces, the two surfaces when placed together could be designed to slide/fit precisely into one another, resulting in extremely exact alignment of two objects. Still another possible application is in connection with (mesoscale) hydrophobicity/philicity, where changes in surface shape could be used to produce surface tension changes, with possible microfluidic applications (e.g., droplet movement).

The process and apparatus of the present disclosure provides a significant advantage in its ability to perform a traditionally complex process in far fewer steps than it would otherwise take if attempted by other traditional manufacturing processes. While the greyscale lithography, the etch (e.g., DRIE), and SOI liftoff operations are performed individually, the combination of the three operations in such a way that each directly prepares the SOI wafer for the next step is significantly more efficient than other traditional processes.

It will also be appreciated that the present invention makes use of various technologies that are not yet widely practiced, or which are used with the present disclosure in a manner that differs from how they are generally traditionally used. For example, greyscale lithography, while known, is not widely used at the present time in common fabrication processes. Similarly, DRIE etching is almost never adjusted to achieve etching ratio selectivities for silicon:resist like 1:1 through 20:1. Even an etching ratio selectivity of 1:2 for silicon:resist could be used. In fact, such etching ratio selectivities would typically be viewed as being incorrect or highly inappropriate by most individuals familiar with using a DRIE process, and changed to produce the usually desired high selectivities such as 100:1. Finally, work with hydrofluoric acid is generally limited for various reasons.

The present disclosure is expected to give rise to new interest in existing technologies in expanding use of existing technologies. For example, while Micro Electro-Mechanical Systems ("MEMS") technology has existed for some time, the applications of the field continue to expand. As new uses and applications slowly become apparent, new needs are expected to arise that require the production of highly detailed, 3D surface structures. The present disclosure is expected to find significant utility in the production of MEMS components such as gears, turbines, shafts, and other like components. Applications in the medical industry in connection with the manufacture of neural probes, and particularly the manufacture of surgical shuttles or "stiffeners" for neural probes, are expected to benefit significantly with the processes and apparatus described herein. Applications in connection with the manufacture of waveguides as well as silicon Fresnel lenses are additional areas where the present disclosure is expected to find utility. Still further, the ability of the present disclosure to enable the fabrication of highly complex patterns of varying height across surfaces arbitrarily sized in X-Y, are likely to have useful patterning applications in the semiconductor chip industry.

While the various methods and embodiments discussed above do not provide for forming overhangs, and only one side can be formed with convex features, these limitations can easily be overcome by adding additional, conventional microfabrication steps.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for at least one of forming or modifying a structure, comprising:
    providing a planar structure having a first material layer disposed on a second material layer;
    using a lithographic greyscale printing operation to produce a resist material layer on the first material layer, the resist material layer having a predetermined three-dimensional pattern formed along X, Y and Z axes, with features having different dimensions along the Z axis, which acts as a mask;
    selecting an etching ratio greater than 1:1 but no more than 20:1 to be used in etching the resist material layer and the first material layer;
    using an etch process, together with the mask provided by the resist material layer, to etch the first material layer to impart the pattern of the mask as an etched pattern into the first material layer in accordance with the selected etching ratio, using only the mask, such that the etched pattern in the first material layer includes a plurality of step-like features formed with different vertical dimensions along the Z axis than corresponding step-like features in the mask of the resist material layer, and the mask is fully etched away in one or more subregions of the mask during the etch process to enable increasing the dimensions of step-like features of the etched pattern along the Z axis beyond Z axis dimensions of the step-like features in the mask; and wherein the step-like features of the etched pattern etched into the first material layer have a depth in accordance with the selected etching ratio, and which are at least one of greater or lesser along the Z axis than the depths of corresponding step-like features in the mask.

2. The method of claim 1, further comprising removing the second material layer after the etch process is complete, leaving only the first material layer.

3. The method of claim 2, wherein removing the second material layer comprises dissolving the second material layer in an acid bath.

4. The method of claim 3 wherein the acid bath comprises a hydrofluoric acid bath.

5. The method of claim 4, wherein the acid bath is carried out over a time period between 24 hours to 36 hours.

6. The method of claim 1, wherein the first material layer includes silicon.

7. The method of claim 1, further including providing at least one of providing or forming an oxide layer on the first material layer opposite to a surface of the first material layer that is etched.

8. The method of claim 1, wherein using an etch process includes using a Deep Reactive Ion Etch (DRIE) process.

9. The method of claim 1, wherein the first material comprises silicon, and wherein the selected etching ratio comprises a ratio of 1:2 of silicon to resist.

10. The method of claim 1, further comprising performing the greyscale printing by controlling an exposure power used during the lithographic operation.

11. The method of claim 10, wherein controlling the exposure power includes using a tool able to provide an exposure from 0 to 510 mJ/cm$^2$.

12. The method of claim 11, wherein controlling the exposure power includes controlling the tool power in steps of 2 mJ/cm$^2$, to carry out the greyscale printing.

13. The method of claim 1, wherein the first material layer and the second material layer are provided on a Silicon On Insulator (SOI) wafer.

14. A method for forming a part, comprising:
    providing a first material layer forming a planar material layer;
    using a lithographic greyscale printing operation to produce a second material layer, the second material layer forming a resist material layer on the first material layer, the resist material layer having a predetermined three-dimensional, step-like pattern extending along X, Y and Z axes, with features having different dimensions extending along the Z axis, which acts as a mask;
    selecting an etching ratio greater than 1:1 but no more than 20:1 to be used in etching the resist material layer and the first material layer;
    using an etch process, together with the mask provided by the resist material layer, to etch the first material layer to impart the step-like pattern of the mask as an etched pattern into the first material layer in accordance with the selected etching ratio, using only the mask, such that the etched pattern in the first material layer includes step-like features formed with different dimensions than corresponding features in the mask of the resist material layer;
    wherein the mask is fully etched away in one or more subregions of the mask during the etch process to enable increasing the dimensions of step-like features of the etched pattern along the Z axis beyond Z axis dimensions of the step-like features in the mask; and
    wherein the step-like features of the etched pattern etched into the first material layer have a depth in accordance with the selected etching ratio, and which are at least one of greater or lesser along the Z axis than the depths of corresponding step-like features in the mask.

15. The method of claim 14, wherein providing a first material layer comprises providing a silicon on insulator (SOI) planar wafer.

16. The method of claim 14, wherein using an etch process comprises using a Deep Reactive Ion Etch (DRIE) process.

17. The method of claim 14, wherein providing a first material layer forming a planar material layer comprises providing a silicon on insulator (SOI) planar wafer having a silicon material layer disposed on a buried oxide layer; and removing the buried oxide layer comprises using an acid bath to remove the buried oxide layer.

18. A method for at least one of forming or modifying a structure, comprising:

providing a planar structure having a first material layer disposed on a second material layer;

using a lithographic greyscale printing operation to produce a resist material layer on the first material layer, the resist material layer having a predetermined three-dimensional pattern formed along X, Y and Z axes, with step-like features having different dimensions along the Z axis, which acts as a mask; and using an etch process to implement a selected etching ratio other than 1:1, and together with the mask provided by the resist material layer, etching the first material layer to impart the predetermined, three-dimensional pattern of the mask as an etched, step-like pattern into the first material layer in accordance with the selected etching ratio, using only the mask, such that the etched step-like pattern in the first material layer includes features formed with different dimensions along the Z axis than corresponding step-like features in the mask of the resist material layer; and wherein the step-like features of the etched pattern etched into the first material layer have a depth along the Z axis in accordance with the selected etching ratio, and which are at least one of greater or lesser along the Z axis than the depths of corresponding step-like features in the mask.

19. A method for forming a part, comprising:

providing a first material layer forming a planar material layer;

using a lithographic greyscale printing operation to produce a second material layer, the second material layer forming a resist material layer on the first material layer, the resist material layer having a predetermined three-dimensional, step-like pattern extending along X, Y and Z axes, with features having different dimensions extending along the Z axis, which acts as a mask;

selecting an etching ratio greater than 1:1 but no more than 20:1 to be used in etching the resist material layer and the first material layer;

using an etch process, together with the mask provided by the resist material layer, to etch the first material layer to impart the pattern of the mask as an etched pattern into the first material layer in accordance with the selected etching ratio, such that the etched pattern in the first material layer includes features formed with different dimensions than corresponding features in the mask of the resist material layer;

wherein the mask is fully etched away in one or more subregions of the mask during the etch process to enable increasing the dimensions of features of the etched pattern along the Z axis beyond Z axis dimensions of the features in the mask; and wherein the features of the etched pattern etched into the first material layer have a depth in accordance with the selected etching ratio, and which are at least one of greater or lesser further comprising removing the second material layer after the etch process is complete, leaving only the first material layer.

\* \* \* \* \*